United States Patent [19]

Schmitz

[11] 3,996,479
[45] Dec. 7, 1976

[54] COMPARATOR/BISTABLE CIRCUIT
[75] Inventor: Johannes J. Schmitz, Catonsville, Md.
[73] Assignee: Westinghouse Electric Corporation, Pittsburgh, Pa.
[22] Filed: July 3, 1975
[21] Appl. No.: 593,084
[52] U.S. Cl. .......................... 307/235 F; 328/147
[51] Int. Cl.² ........................................ H03K 5/20
[58] Field of Search ....... 307/235 F, 235 H, 235 K, 307/290, 291, 235 R; 328/146, 147

[56] References Cited
UNITED STATES PATENTS
3,531,726  9/1970  Whigham ......................... 328/147

Primary Examiner—John Zazworsky
Assistant Examiner—Marcus S. Rasco
Attorney, Agent, or Firm—M. P. Lynch

[57] ABSTRACT

In a comparator/bistable circuit, wherein the bistable circuit is tripped in response to a predetermined relationship between first and second inputs supplied to a comparator circuit, one of the inputs to the comparator circuit is supplied as an input to an adjustable reset circuit which develops the bistable reset level as a percentage function of one of the comparator input signals. This contrasts with the conventional technique of developing the bistable reset level as a feedback function of the output of the bistable circuit.

8 Claims, 2 Drawing Figures

COMPARATOR/BISTABLE CIRCUIT

BACKGROUND OF THE INVENTION

In numerous control requirements, including those related to nuclear reactors, a variety of comparator/bistable circuits are used to monitor critical parameters and initiate alarm and other control functions for safe equipment operation. In most of the conventional comparator/bistable circuits, the bistable reset level is a constant magnitude signal developed by the fixed voltage output of the bistable circuit during the bistable circuit tripped state (on-state). Inasmuch as the voltage output of the bistable circuit in its trip state is of a constant value and is not a function of the bistable input trip voltage level determined by the input signals to the comparator circuit, the selection of a trip voltage level having a magnitude less than the magnitude of the reset level will prevent resetting of the bistable thus rendering the compartor/bistable circuit inoperative. In this situation it is required to then remove excitation power to the bistable circuit in order to reset it. This situation can be more clearly understood if it is assumed that a reset level having a magnitude of 5 volts is established by the output of the bistable circuit which means the bistable circuit will be reset when the magnitude of the trip level developed by the comparator circuit diminishes by 5 volts. If, however, a trip level of 3 volts is selected to trip the bistable circuit, then it is apparent that the trip level will never diminish the required 5 volts necessary to reset the bistable circuit.

SUMMARY OF THE INVENTION

There is described herein with reference to the accompanying drawing a comparator/bistable circuit wherein an adjustable reset level for the bistable circuit is developed as a percentage of one of the input signals supplied to the comparator circuit. A reset signal circuit responds to one of the inputs to the comparator circuit by developing a reset signal level which is a percentage of the selected comparator input signal level. The output signal developed by the bistable circuit in response to a trip input from the comparator circuit gates this reset signal to an input of the bistable circuit as a positive feedback signal. When the relationship of the input signal to the comparator circuit is such that the trip signal to the bistable circuit diminishes to a value equal to or less than the level of the reset signal, the reset signal will reset the bistable circuit. Inasmuch as the level of the reset signal is always a percentage of one of the inputs to the comparator circuit, the reset level will never exceed the trip level signal thus assuring resetting of the bistable circuit under all conditions.

A potentiometer is included in the reset circuit to develop the reset signal corresponding to a selected percentage of one of the inputs to the comparator circuit. Typically, the potentiometer will develop a reset signal which corresponds to between 10% and 99% of an input signal supplied to the comparator circuit.

DESCRIPTION OF THE DRAWINGS

The following invention will become more readily apparent from the following exemplary description in connection with the accompanying drawings.

DESCRIPTION OF THE PREFERRED EMBODIMENT

Figure 1:
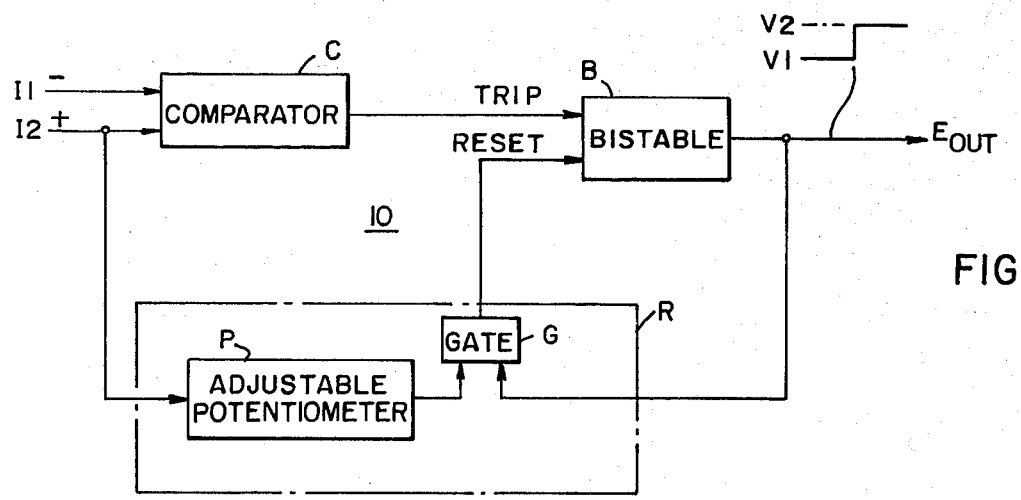
FIG. 1 is a basic block diagram illustration of a comparator/bistable circuit incorporating the invention.

Referring to FIG. 1 there is illustrated a comparator/bistable circuit 10 including a bistable circuit B which is tripped by the output of a comparator circuit C in response to a predetermined relationship between the input signals I1 and I2, and is reset by the signal developed by the adjustable potentiometer P which is gated through gate circuit G by the output signal $E_{out}$ of the bistable circuit B in response to a trip condition. The input signals I1 and I2 can represent separate parameter measurements such as reactor loop flow and neutron power level in a nuclear reactor application, or one signal can represent a variable parameter condition while the second input corresponds to a reference signal. In the latter situation, the variable input signal is used to develop the reset signal.

The comparator circuit C responds to a deviation in a preset balance between the input signal I1 and I2 by generating a trip signal for the bistable circuit B which results in a step change in the ouput voltage level of the bistable circuit from a first voltage level V1 to a second voltage level V2. It is apparent that the voltage levels V1 and V2 can be of any magnitude and polarity. Furthermore, depending on the circuit components selected, the output voltage of bistable circuit B may change from either a low voltage level to a high voltage level or from a high voltage level to a low voltage level in response to a trip condition.

One of the variable inputs to the comparator circuit C, herein selected to be input signal I2, is further applied as an input signal to a reset circuit R represented as consisting of adjustable potentiometer P and gate circuit G. In the event that both input signals I1 and I2 represent variable parameter conditions, either of the input signals can be selected as the input to the reset circuit R. A reset signal which is a percentage of input signal I2 is developed by the adjustable potentiometer P. This reset signal is supplied as an input to the bistable circuit B via the gate circuit G. The gate circuit G responds to the output voltage level of the bistable circuit B corresponding to a trip condition and transmits the reset signal by applying it as a reset input signal to the bistable circuit B. The reset signal in turn functions to reset bistable circuit B when the trip signal input to the bistable circuit B diminishes to a level corresponding to the level of the reset signal. Typically, the adjustable potentiometer circuit P can develop a reset signal which represents a percentage of the selected comparator input signal in a range of from about 10 to 99 percent. It is apparent from the operation of the embodiment of FIG. 1 that the reset signal is always a percentage of one of the input signals supplied to the comparator circuit and thus the level of the reset signal will always be such that resetting of bistable circuit B can be accomplished regardless of the output voltage levels V1 and V2 of the bistable circuit B. This contrasts with prior art techniques wherein the reset signal is a function of the bistable output voltage levels which are totally independent of the level of the trip input signal applied to the bistable circuit B. This independent relationship, as discussed previously, can result in a situation where the reset signal is ineffective.

Figure 2:
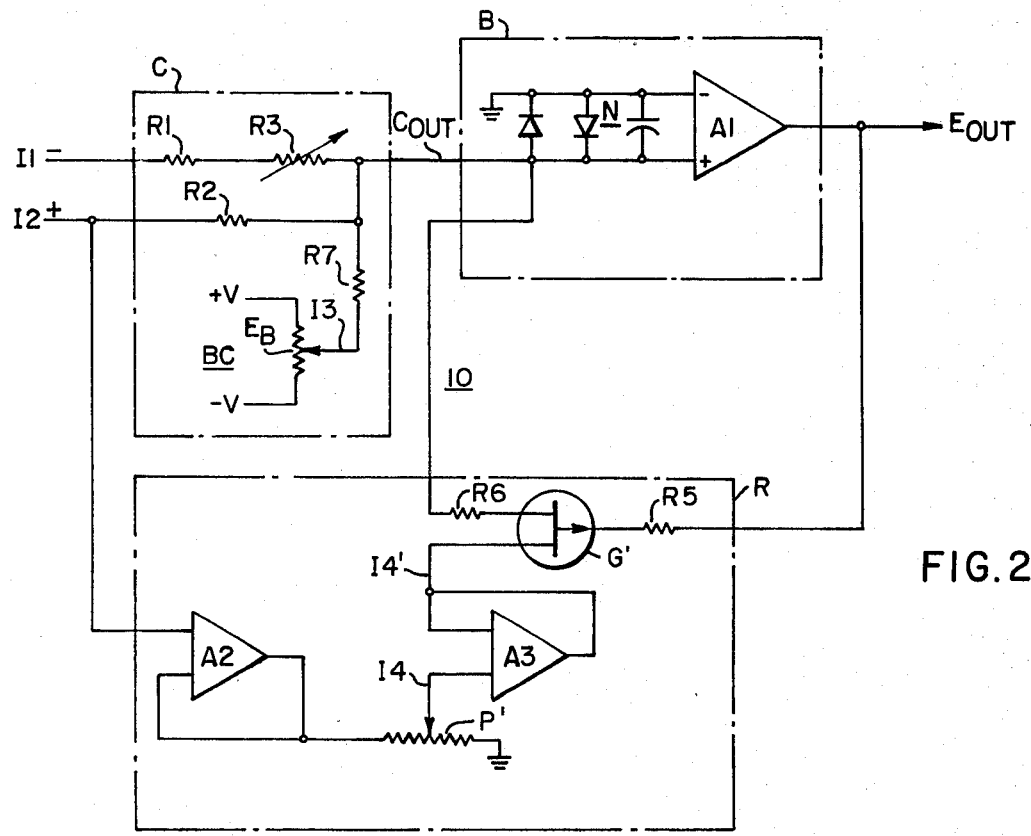
FIG. 2 is a detailed schematic of an embodiment of FIG. 1.

A typical implementation of the block diagram of FIG. 1 is illustrated schematically in FIG. 2.

The comparator circuit C includes signal input resistors R1 and R2, gain control variable resistor R3 and a bias control circuit BC consisting of bias input resistor R7 and bias control variable resistor $E_B$. The bias control circuit BC is not essential for the operation of the reset circuit R but may be included as a particular application of circuit 10 dictates.

Two independent variable signals I1 and I2 of opposite direct current polarity (I1 is here assumed to be negative, I2 a positive level) are current summed with the bias signal I3 at the junction of R2, R3 and R7. The bias signal current must be either of a positive or negative value depending on the positive/negative ratio between I2/I1 in order to make the summed output $C_{out}$ of the comparator circuit C a negative value, which is fed to the positive input terminal of operational amplifier A1 in bistable circuit B. Under the above conditions where the signal $C_{out}$ of comparator circuit C is negative the bistable circuit B will be in a reset or OFF state. Gain control variable resistor R3 provides a means for varying the signal level change required to produce a positive output $C_{out}$ and is commonly referred to as a gain adjustment. The capacitor-diode network N connected between circuit common and the positive input of amplifier A1 provides noise and overvoltage protection for the input of amplifier A1. The negative input of amplifier A1 is connected to common. The output $E_{out}$ of the operational amplifier A1 is at signal common level or zero volts with the bistable in its reset or OFF condition, shown on the output diagram as V1. When one of the inputs I1 or I2 to comparator C changes its signal value such that the output signal $C_{out}$ becomes postive, the operational amplifier A1 will amplify this level change and very rapidly swing its output $E_{out}$ to a maximum postive value due to its very high open loop gain. This step change in the output of bistable circuit B constitutes the bistable tripped, or ON condition shown as V2. In the absence of reset circuit R the bistable circuit B would reset to its reset or OFF state (V1) when the output $C_{out}$ of comparator circuit C approached a zero level.

The reset circuit R, as illustrated in FIG. 2, provides a variable bistable reset loop width for circuit 10 which is a percent-function of input signal level I2. The reset circuit R is composed of two unity gain operational amplifiers A2 and A3 (connected as buffer amplifiers to completely isolate its load from its input), field effect transistor switch G', resistors R5 and R6, and reset control variable resistor P'. The current amplified output of amplifier A2 is always identical in magnitude to the input I2 without loading the input of the comparator circuit C thus assuring maximum linearity for the reset function. The reset signal I4 from the wiper of varible resistor P' is fed via buffer amplifier A3 to switch G'. The reset signal I4 is always in direct proportion to input signal I2 with its ratio to the input signal I2 depending on the adjustment of variable resistor P'. With bistable circuit B in its reset or OFF state, the gate input of FET transistor switch G' is at zero potential and the switch G' is open. With the bistable circuit B in the tripped or ON stage, a positive signal is fed via resistor R5 to the gate of switch G' rendering it conductive and thus connecting the reset signal I4' of amplifier A3 via resistor R6 to the positive input of the amplifier A1. In order to reset bistable circuit B, the output $C_{out}$ of comparator circuit C must go to a negative level sufficient enough to overcome the additional current supplied by the reset circuit R via resistor R6. Thus, the bistable reset loop width is increased in direct proportion to the input signal I2 as selected by variable resistor P'.

Should signal input I1 be chosen as the variable reset input, then either buffer amplifier A2 or A3 must also include an inverter since the reset signal I4' must always be a positive signal. Further, if a negative voltage output of the bistable circuit B represented a tripped or ON condition, a depletion mode FET transistor swtich would be used.

In contrast to the prior art techniques for developing reset signals as a function of the output voltage level of the bistable circuit B, the reset signal developed in the embodiment of FIG. 2 corresponds to the current flow through the load resistor R6 in response to the reset signal produced by the variable resitor P'.

I claim:
1. The combination of,
   a comparator circuit means for comparing first and second input signals and generating a trip signal at an output in response to a predetermined relationship between said input signal, a bistable circuit means having a trip and reset state and an input connected to the output of said comparator circuit means, said trip signal establishing said bistable circuiting trip state, and a reset circuit means having an input and an output, one of said input signals to said comparator circuit means being supplied to the input of said reset circuit means, the output of said reset circuit means being coupled to the input of said bistable circuit means, said reset circuit means responding to the trip state of bistable circuit means by supplying a reset signal to said bistable circuit means which is a predetermined portion of said input signal supplied to said reset circuit means.

2. The combination of claim 1 wherein said reset circuit means includes a signal attenuating means to develop said reset signal having a magnitude in a range of about 10% to 99% of the magnitude of said input signal.

3. The combination of claim 1 wherein at least one of said first and second input signals is a variable input signal, said variable input signal being supplied as said input signal to said reset circuit means.

4. The combination of claim 2 wherein said signal attenuating means includes a variable resistor to select a percentage of said input signal as said reset signal.

5. The combination of, a comparator curcuit means for comparing first and second input signals and generating a trip signal at an output in response to a predetermined relationship between said input signals, a bistable circuit means having a trip and reset state and an input connected to the output of said comparator circuit means, said trip signal establishing said bistable circuit trip state, and a reset circuit means having an input and an output, one of said input signals to said comparator circuit means being supplied to the input of said reset circuit means, the output of said reset circuit means being coupled to the input of said bistable circuit means, said reset circuit means responding to the trip state of said bistable circuit means by supplying a reset signal to said bistable circuit means which is a predetermined portion of said input signal supplied to said reset circuit means, said reset circuit means including a signal conditioning means to develop said reset signal having a magnitude which is a function of the magnitude of said input signal and switch means responsive to said trip state of said bistable circuit means by supplying said reset signal to said bistable circuit means.

6. The combination of claim 5 wherein said switch means is a field effect transistor.

7. The combination of claim 1 further including a bias control circuit means connected to said comparator circuit means.

8. The combination of claim 1 wherein said reset circuit means includes electrical isolation means to electrically isolate the input of said comparator circuit means from the output of said reset circit means.

* * * * *